United States Patent
Khalil et al.

(10) Patent No.: US 7,039,887 B2
(45) Date of Patent: May 2, 2006

(54) METHOD AND APPARATUS FOR ENHANCING THE PERFORMANCE OF EVENT DRIVEN DYNAMIC SIMULATION OF DIGITAL CIRCUITS BASED ON NETLIST PARTITIONING TECHNIQUES

(75) Inventors: Nadim Khalil, Southborough, MA (US); Stuart Rae, Jefferson, MA (US); Rahul Razdan, Princeton, MA (US); David Roberts, Hollis, NH (US)

(73) Assignee: Cadence Design Systems, Inc., San Jose, CA (US)

( * ) Notice: Subject to any disclaimer, the term of this patent is extended or adjusted under 35 U.S.C. 154(b) by 157 days.

(21) Appl. No.: 10/272,540

(22) Filed: Oct. 15, 2002

(65) Prior Publication Data

US 2004/0073876 A1    Apr. 15, 2004

(51) Int. Cl.
*G06F 17/50*    (2006.01)
(52) U.S. Cl. .................. 716/5; 716/6; 716/7; 716/18
(58) Field of Classification Search ............... 716/1–8, 716/18; 703/17, 19
See application file for complete search history.

(56) References Cited

U.S. PATENT DOCUMENTS

| | | | | |
|---|---|---|---|---|
| 5,107,208 A | * | 4/1992 | Lee | 714/733 |
| 5,331,568 A | * | 7/1994 | Pixley | 716/3 |
| 5,392,227 A | * | 2/1995 | Hiserote | 703/14 |
| 6,523,155 B1 | * | 2/2003 | Ruedinger | 716/7 |
| 6,536,028 B1 | * | 3/2003 | Katsioulas et al. | 716/17 |
| 6,567,962 B1 | * | 5/2003 | Baumgartner et al. | 716/6 |
| 6,681,377 B1 | * | 1/2004 | Beletsky | 716/6 |
| 6,763,505 B1 | * | 7/2004 | Baumgartner et al. | 716/5 |
| 2002/0147555 A1 | * | 10/2002 | Nagata et al. | 702/70 |

OTHER PUBLICATIONS

Marschner, Erich et al., "Fast, Thorough, Full-Chip Implementation Verification", Same 2000, Oct. 25, 2000, pp. 1-6.

* cited by examiner

*Primary Examiner*—Paul Dinh
(74) *Attorney, Agent, or Firm*—Bingham McCutchen LLP (57) ABSTRACT

Disclosed is a full-chip level verification methodology that combines static timing analysis techniques with dynamic event-driven simulation. The specification discloses a capability to partition a multiple-clock design into various clock domains and surrounding asynchronous regions automatically and to determine the timing of the design on an instance by instance basis. Static timing analysis techniques can be leveraged to verify the synchronous cores of each clock domain. The asynchronous regions of the design and the interaction between synchronous cores of the clock domains are validated using detailed dynamic event-driven simulation without the burden of carrying the interior timing attributes of the synchronous cores that have already been verified.

48 Claims, 7 Drawing Sheets

METHOD AND APPARATUS FOR ENHANCING THE PERFORMANCE OF EVENT DRIVEN DYNAMIC SIMULATION OF DIGITAL CIRCUITS BASED ON NETLIST PARTITIONING TECHNIQUES

BACKGROUND AND SUMMARY OF THE INVENTION

The present invention relates generally to the functional verification of electronic designs and more particularly to the partitioning of a design under verification for the integration of dynamic simulation and static timing analysis methodologies. Today's engineers are faced with an increasing difficult task of handling the verification of state-of-the-art system-on-chip (SoC) designs. The various verification techniques in use fall into two major categories, namely the dynamic event-driven simulation and the static timing analysis (STA) techniques. STA techniques are based on simplifying the general model of event-driven computation to that of a synchronous model. By taking advantage of the separation of the timing and functional behavior made possible by the synchronous design style, STA tools can apply complete, rigorous, and efficient algorithms that result in an overwhelming performance advantage when compared to event-driven simulation.

Figure 1:
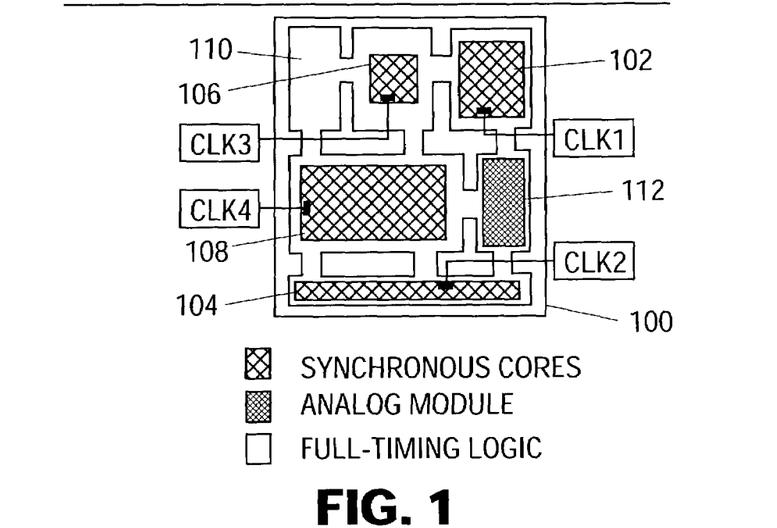
FIG. 1 depicts an illustration of a fill-chip design.

However, the STA techniques are not directly applicable to most designs at the full-chip level. This is because most designs are a combination of synchronous logic blocks and asynchronous logic blocks, or other non-synchronous design blocks, such as embedded analog blocks. One illustration of such a full-chip design 100 is shown in FIG. 1. This exemplary full-chip design consists of four clock domains: block 102 is driven by CLK1; block 104 is driven by CLK2; block 106 is driven by CLK3; and block 108 is driven by CLK4. In addition, the design also contains an asynchronous block 110 and an analog block 112. As shown in FIG. 1, a typical design at the full chip level violates the separation of timing and functionality implicit in the synchronous model. Although most of the modules might be synchronous, the clocking methodology that has four different clock domains can result in asynchronous interaction with each other. Furthermore, the design could contain non-synchronous design constructs 110 and 112 that cannot be verified by STA techniques.

As a result, both sets of solutions have their unique problems when applied to the verification of a complete design. On one hand, the static verification algorithms require strict adherence to the synchronous design style. On the other hand, the dynamic event-driven simulation is limited by the computing power and memory capacity of the computers used. Therefore, it would be advantageous to have an improved method for full chip level verification.

Disclosed is a full-chip level verification methodology that combines static timing analysis techniques with dynamic event-driven simulation. The specification discloses capabilities to partition a multiple-clock design into various clock domains and surrounding asynchronous regions automatically and to apply timing behavior during simulation on an instance by instance basis.

Static timing analysis techniques can be leveraged to verify the synchronous cores of each clock domain. The asynchronous regions of the design and the interaction between synchronous cores of the clock domains are validated using detailed dynamic event-driven simulation without the burden of carrying the interior timing attributes of the synchronous cores that have already been verified. With the unnecessary interior timing attributes of synchronous cores removed during dynamic simulation, the disclosed method accelerates the verification process and requires less computing power and memory capacities to complete the verification of the full chip.

BRIEF DESCRIPTION OF THE DRAWINGS

The accompanying drawings are included to provide a further understanding of the invention and, together with the detailed description of the preferred embodiment, serve to explain the principles of the invention.

DETAILED DESCRIPTION

The disclosed methodology leverages the fact that the synchronous parts of a design have been validated by STA techniques to accelerate full-chip simulation by removing the timing from their synchronous cores. Synchronous cores are determined by netlist partitioning that can be applied at the module level or at the full-chip level. Partitioning at the module level preserves the intended design hierarchy and is a natural extension of the exiting STA techniques. However, when partitioning is applied at the full-chip level, larger synchronous cores are defined since they can include the inter-block regions separating two synchronous blocks controlled by the same clock. Furthermore, the synchronous regions determined by full-chip partitioning are delimited by sequential elements. After partitioning, the timing of the synchronous regions of each clock is verified by STA tools. Having verified the timing of the synchronous cores using STA techniques and generated the corresponding assertion for assumption verification, the design is now ready for full-chip dynamic simulation. Effective full chip verification is achieved by providing simulation acceleration on the synchronous cores and using assertions to validate the STA assumptions.

Detail timing removal from the synchronous core simulation is possible because the core timing have been verified by STA tools. Indeed, timing within the synchronous core is determined by the clocking of the storage elements and not by timing delay propagation. Thus, each sequential stage can be viewed as a static network that is evaluated once for every clock edge. The combinational logic evaluation step can then be collapsed into a single cycle triggering cycle optimizations such as compiling zero-delay logic cones. Eliminating output scheduling also reduces simulation overhead. Timing removal enables efficient full-chip simulation. The simulation can be focused on the interactions between clock domains and the non-synchronous regions of the design such as asynchronous and analog constructs. Hence, timing removal can result in dramatically faster simulation runtimes as well as potentially higher simulation capacity.

The disclosed design partitioning methodology divides all the nets of a full-chip design into regions that should be simulated with Full-Timing, and regions that could be simulated with timing removal. The method comprises three main phases: 1) Clock Domain Determination phase; 2) Netlist Coloring phase; and 3) Timing Determination phase.

A clock domain is defined to contain all sequential elements controlled by a single clock signal together with the combination logic driven by these elements. Determining clock domain is achieved by recognizing exclusivity regions that isolate the domain from the rest of the design. Exclusivity regions stop the flow of data into and out of the domain. The two primary elements that are capable of stopping the flow of data are Flip-Flops and Latches. A Flip-Flop or edge-triggered device is "self exclusive" or able to avoid data seepage by its very nature. Latches are level sensitive devices that are open when their controlling clock is active. In a latch-based design, exclusivity is achieved when closed or inactive Latches stop data flow. This is usually implemented using a multiple-phased clocking scheme. Because these clock phases never occur at the same time, the Latches in an exclusivity region are never open at the same time, thus stopping the flow of data at the boundary of the clock domain. Indeed a Flip-Flop can be thought of as a combination of two Latches: a master and a slave that are always enabled during different phases of the driving clock.

On the other hand, to detect exclusivity regions in a latch-based design, it is important to understand the relationships between co-operating clocks. A number of issues are tracked such as the 'active' phase of the Latches, the relationship of all clocks, as well as the effect that a clock path might have on a latch's active phase.

Figure 2:
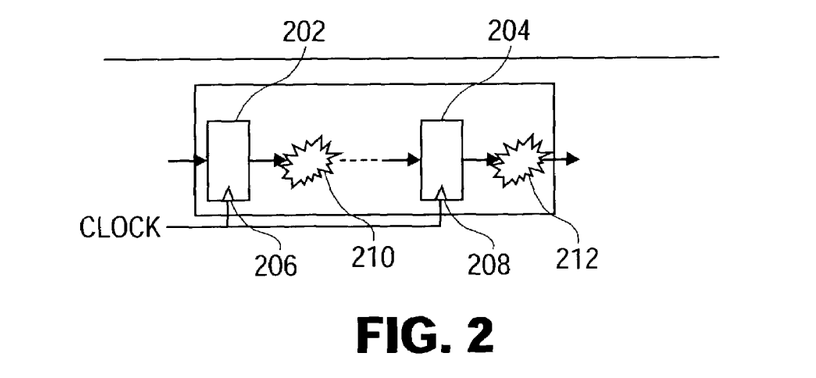
FIG. 2 depicts one approach for determining clock domains.

FIG. 2 illustrates one approach to determine clock domains among various circuit elements. Determining the clock domains of a design comprises the step of identification of sequential elements and followed by the step of Clock Walking. In the step of identification of Sequential Elements, the cells in the design are analyzed to determine which cell is sequential in nature. In FIG. 2, the sequential elements such as the Flip-Flops 202 and 204 are identified in this step. The clock-ports 206 and 208 as well as any set or reset ports of each sequential cell are also identified.

In the Clock Walking step, the list of sequential elements and a user-defined list of input clock signals are traversed starting at the clock pins. The Clock Walking process consists of tracing the loads of user-defined clock signals progressively, until all sequential elements controlled by the given clock signal are determined. The effect of the clock path on the clock signal is also tracked during Clock Walking to determine a latch's active phase. This is used for the detection of exclusivity regions in latch-based designs.

Sequential elements that remain without a controlling clock signal after the Clock Walking step are potentially part of an asynchronous design construct. They are treated as combinational logic in the Netlist Coloring phase.

A clock domain can further be divided into its synchronous core operating in a predictable step-by-step timing pattern with respect to the clock and the remaining logic where asynchronous interactions with the rest of the design can occur. It follows that the elements within a synchronous region can be simulated with No-Timing (NT) whereas those in the periphery should be run in Full-Timing (FT) mode. The purpose of partitioning is to separate the design elements that must operate at Full-Timing from those elements that can operate with no timing without impacting the functional and timing characteristics of the surrounding logic. Whereas combinational cells are divided into Full-Timing or no timing groups, the sequential cells are further subdivided into groups depending on the enabling or disabling of their capability to verify timing checks (i.e. setup and hold constraints).

Figure 3:
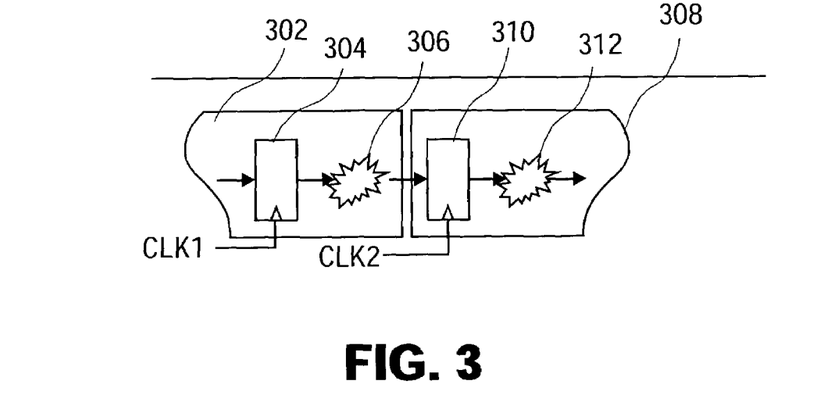
FIG. 3 depicts one approach for crossing between two clock domains.

A key to applying the rules of partitioning is recognizing domain crossings and exclusivity regions. Domain crossing occurs when a logic element from one clock domain drives a logic element in another clock domain. FIG. 3 illustrates one approach to recognize such a domain crossing, where the CLK 1 domain consists of exemplary Flip-Flop 304 and combinational logic 306 elements. Similarly, the CLK2 domain consists of exemplary Flip-Flop 310 and combinational logic 312 elements. Electronic data cross the clock domains from the combinational logic element 306 in CLK1 domain to the Flip-Flop 310 element in CLK2 domain.

Once the clock domains have been determined, the algorithm moves to the Netlist Coloring phase. The objective of the Netlist Coloring phase is to label each port of every instance in the design by a color, represented by a positive integer number that identifies the controlling signal. There are two types of controlling signals: 1) clocks; and 2) external pin signals.

Each clock is identified by its own color and the Color-Zero is used to identify the signals that should operate in Full-Timing. Initially all external pins of the design are assigned the Color-Zero except for the clock pins. External pin signals can change independently of clocks; therefore they are simulated in Full-Timing to capture accurate interaction of the design with the external world. The colors are then propagated to the rest of the netlist by forward traversal with different coloring procedures applied to combinational instances, Flip-Flop instances and latch instances. During netlist traversal, all the traversed ports are stored on a stack. This stack is cleared each time the propagated color changes when a Flip-Flop or a latch-based exclusivity region is reached. If the traversal reaches a different color domain or an output port, then the ports on the stack are assigned the Color-Zero. This process ensures that all the inter-clock regions as well as the output periphery regions are operating in Full-Timing in order to account for accurate asynchronous timing interactions.

Figure 4:
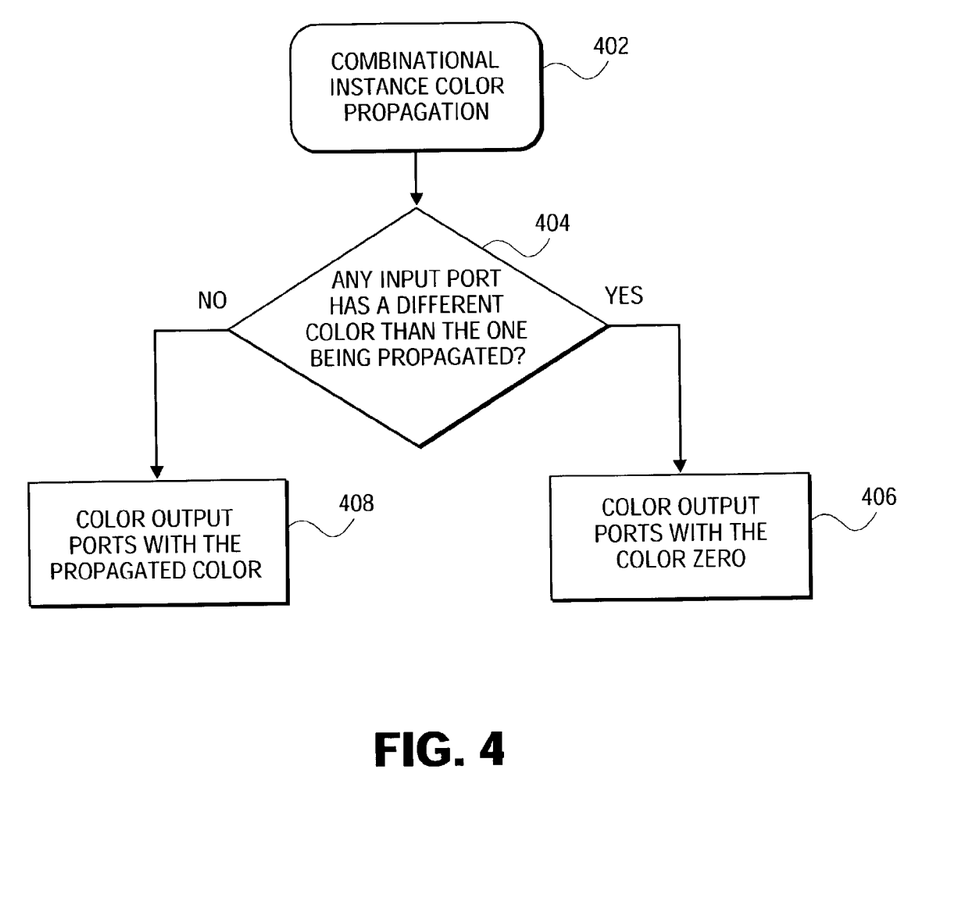
FIG. 4 depicts one approach for propagating color through a combinational instance.

FIG. 4 illustrates one approach to propagate color through a combinational instance. The method begins at block 402, and thereafter passes to block 404 where a determination is made as to whether or not any input port has a different color than the one being propagated. If this condition is true, then the "Yes" path is taken and the output ports are colored with the Color-Zero (block 406). Alternatively, if the condition is false, then the "No" path is taken and the output ports of the cell are colored with the color being propagated (block 408). In the case that at least two asynchronous signals interact at an instance, the outputs will be labeled with the Color-Zero and therefore the Full-Timing simulation of this instance is used.

This discussion of partitioning and coloring includes examples of embodiments that are in the presence of set and reset ports. Both port types have similar characteristics and effects on the partitioning procedure. The discussion may also include examples of embodiments in the presence of reset ports, however, the partitioning and coloring is also valid for embodiments that include the presence of set port.

Figure 5:
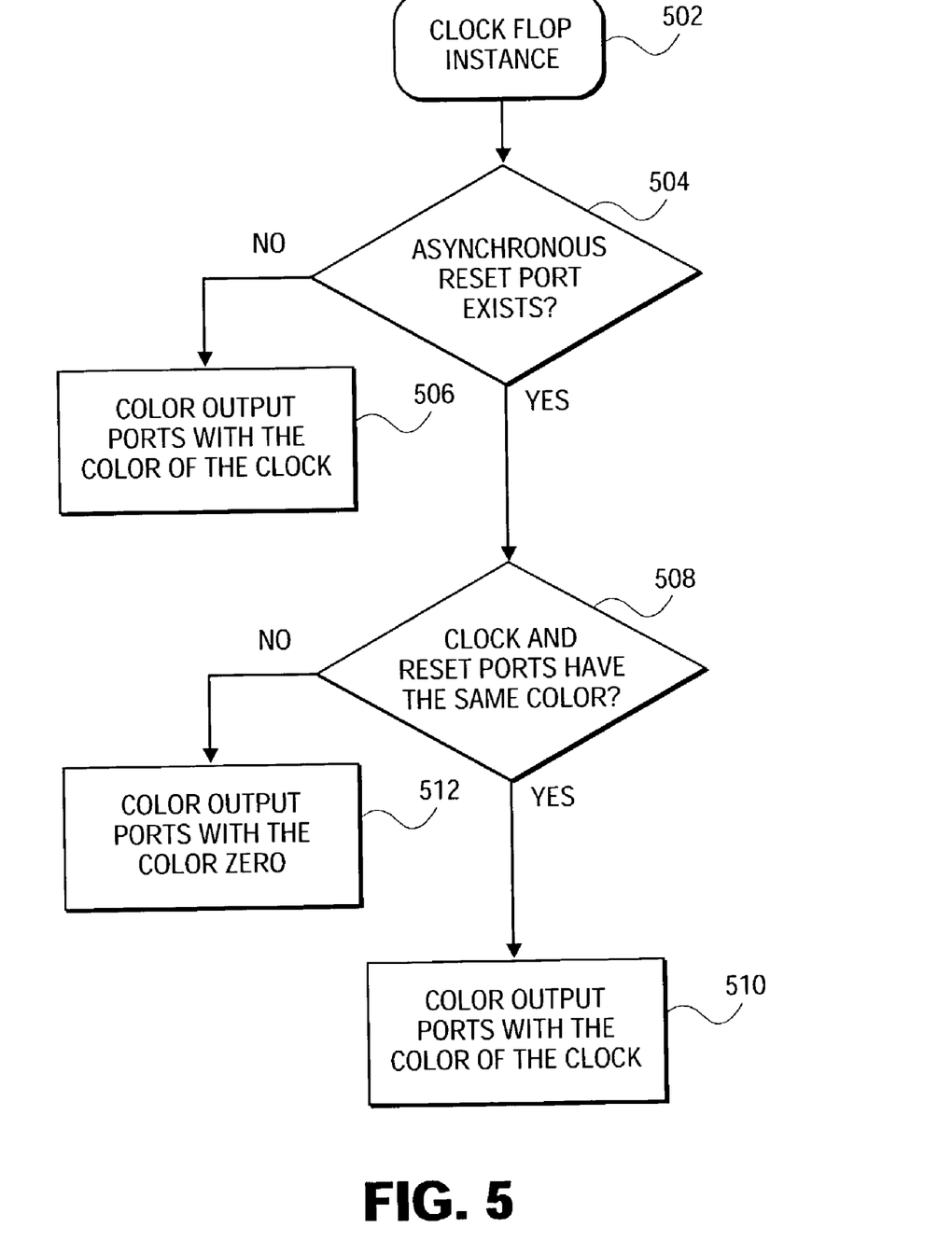
FIG. 5 depicts one approach for propagating color through a Flip-Flop instance.

FIG. 5 illustrates one approach to propagate color through a Flip-Flop instance. A Flip-Flop is an edge-triggered sequential device that is controlled by the rising or falling edge of the enabling clock signal. The methodology distinguishes between Flip-Flops with asynchronous reset; and those with synchronous reset or no reset i.e. synchronous Flip-Flops. The method begins at block 502, and thereafter passes to block 504 where a determination is made as to whether an asynchronous reset port exists. If an asynchronous reset port does not exist, i.e. the Flip-Flop is synchronous, the "No" path is taken and the output will be labeled with the same color as the clock (block 506), regardless of the color of the other input data signals since output changes are affected the clock signal transitions only. But if the Flip-Flop has an asynchronous reset port, changes in the output signals can occur independently of the clock when the asynchronous reset is activated. Then the "Yes" path is taken and the method continues at block 508 where a second determination is made as to whether or not the clock and reset ports have the same color. If both clock and reset ports have the same color, the output will be labeled with that same color (block 510). But if the colors of clock and reset ports are different, the output will be labeled with Color-Zero (block 512, indicating Full-Timing simulation is used).

Figure 6:
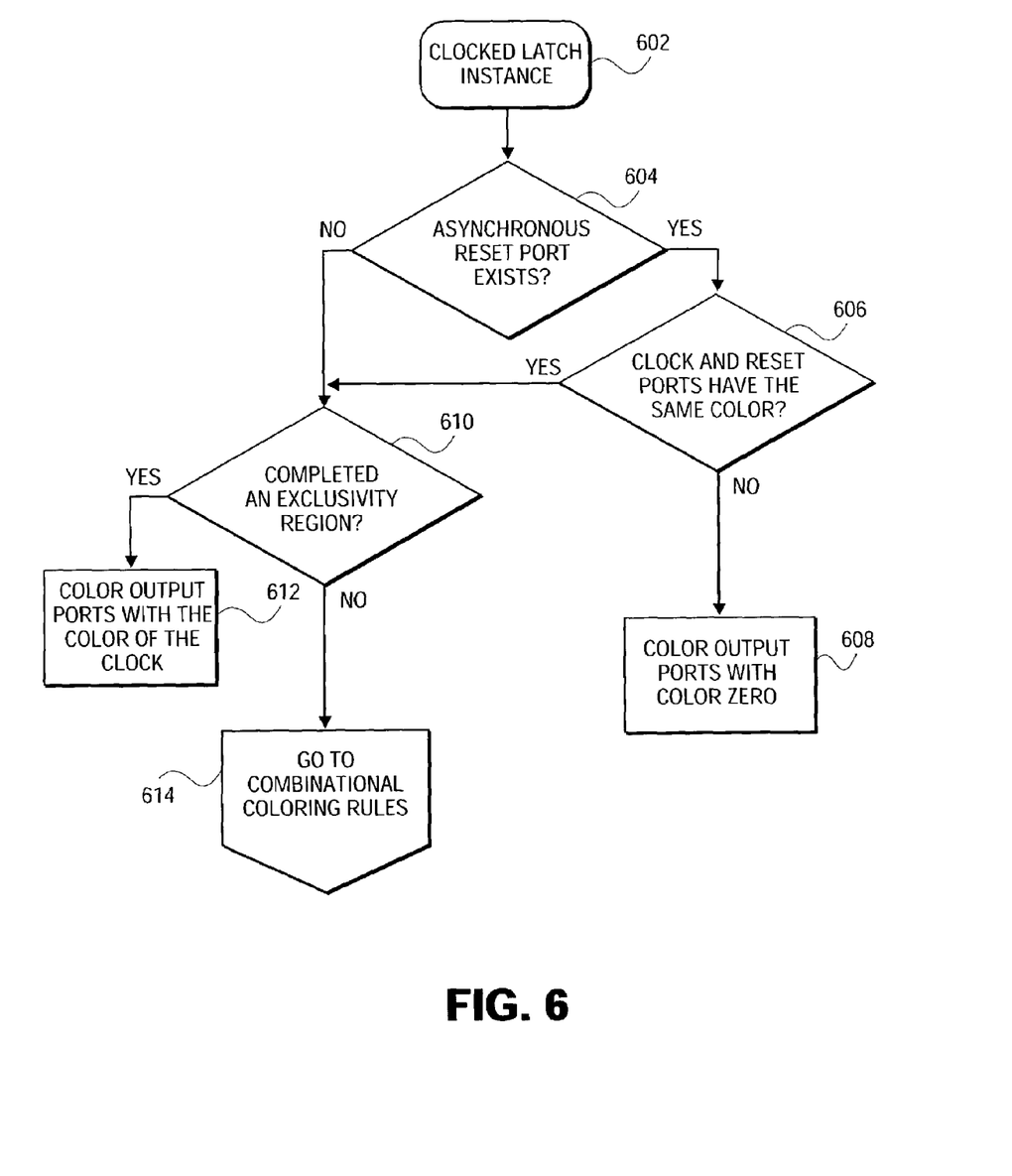
FIG. 6 depicts one approach for propagating color through a latch instance.

FIG. 6 illustrates one approach to propagate color through a latch instance. A latch is a level sensitive device that is open when it controlling signal is active. While a Flip-Flop is self-exclusive by it very nature, a latch has to be controlled with clock signals that have the proper phase relationships to build an exclusivity region. In a latch-based design, inactive clock phases of a latch interrupt the flow of data. To detect a latch-based exclusivity region, the active phases of the latch and the relationship of all the co-operating clock phases have to be tracked. A latch can also have synchronous or asynchronous reset pins. A latch output color depends on whether an exclusivity region has been detected. If an exclusivity region has not been detected, then the data signal transition can affect the output signal when the clock is active. In this situation the three signals, namely data input, clock, and reset are taken into consideration when coloring the output. As shown in FIG. 6, the method begins at block 602, and thereafter passes to block 604 where a first determination is made as to whether an asynchronous reset port exists. If there is asynchronous reset port, then the "Yes" path is taken and the method continues at block 606 where a second determination is made as to whether the clock and reset ports have the same color. If the color and reset ports have different colors, then the output ports is colored with Color-Zero (block 608). But if an asynchronous reset port does not exist or the color and reset ports have the same color, then the method continues at block 610 where a third determination is made as to whether there is an exclusivity region. If there is an exclusivity region, then the output ports are colored with the color of the clock (block 612). Alternatively, the method moves to block 614 where the latch instance is treated the same as a combinational instance as described in FIG. 4.

In one exemplary approach, the event driven simulator has the capability of simulating a cell instance in one of the four possible timing modes on an instance-by-instance basis. The four timing behavior modes for a cell instance in this exemplary design are:

Full-Timing mode: Complete timing simulation is done.
No Timing mode: All timing delays and timing checks are removed.
Timing Checks mode (for sequential cells only): Input timing checks are performed.
I/O Delays mode (for sequential cells only): I/O path delays are included. After the Netlist Coloring phase, the mode of timing simulation is determined based on the color of the inputs and outputs of an individual instance. The following examples are used to identify the timing status of a cell in a design.

Figure 7:
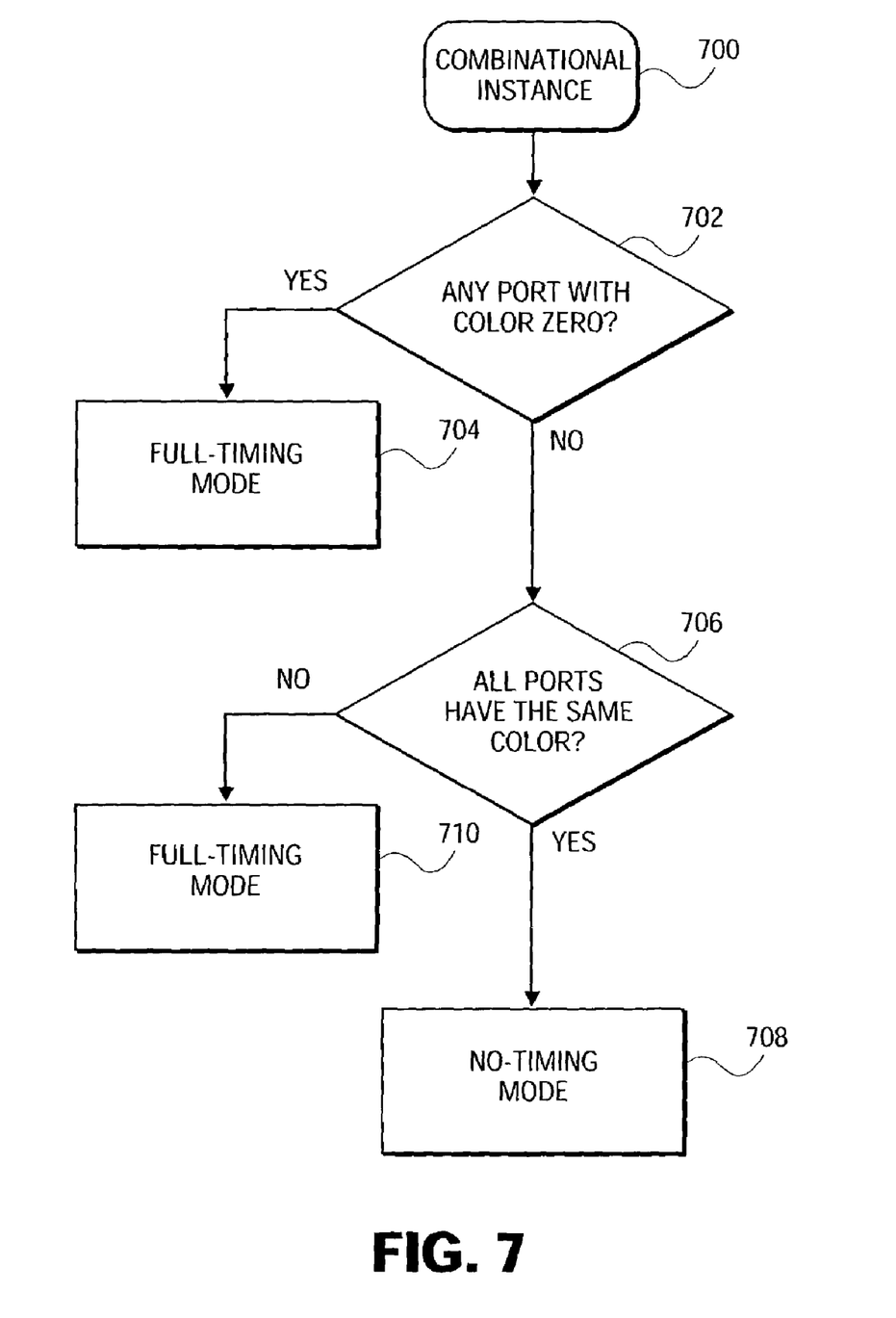
FIG. 7 depicts one approach for determining timing for a combinational instance.

FIG. 7 illustrates one approach for determining timing for a combinational cell instance. The method starts at block 700 and thereafter passes to block 702. A determination is made in block 702 as to whether or not any port has Color-Zero. If any port is labeled with a Color-Zero, this instance is to be simulated in the Full-Timing mode (block 704). If no port has Color-Zero, then the "No" path is taken and the method continues at block 706 where a second determination is made as to whether or not all ports have the same color. If there are any two ports have different colors, then this instance is simulated in the Full-Timing mode (block 710). Otherwise, if all the ports have the same color, then this instance is simulated in the No Timing mode (block 708).

Figure 8:
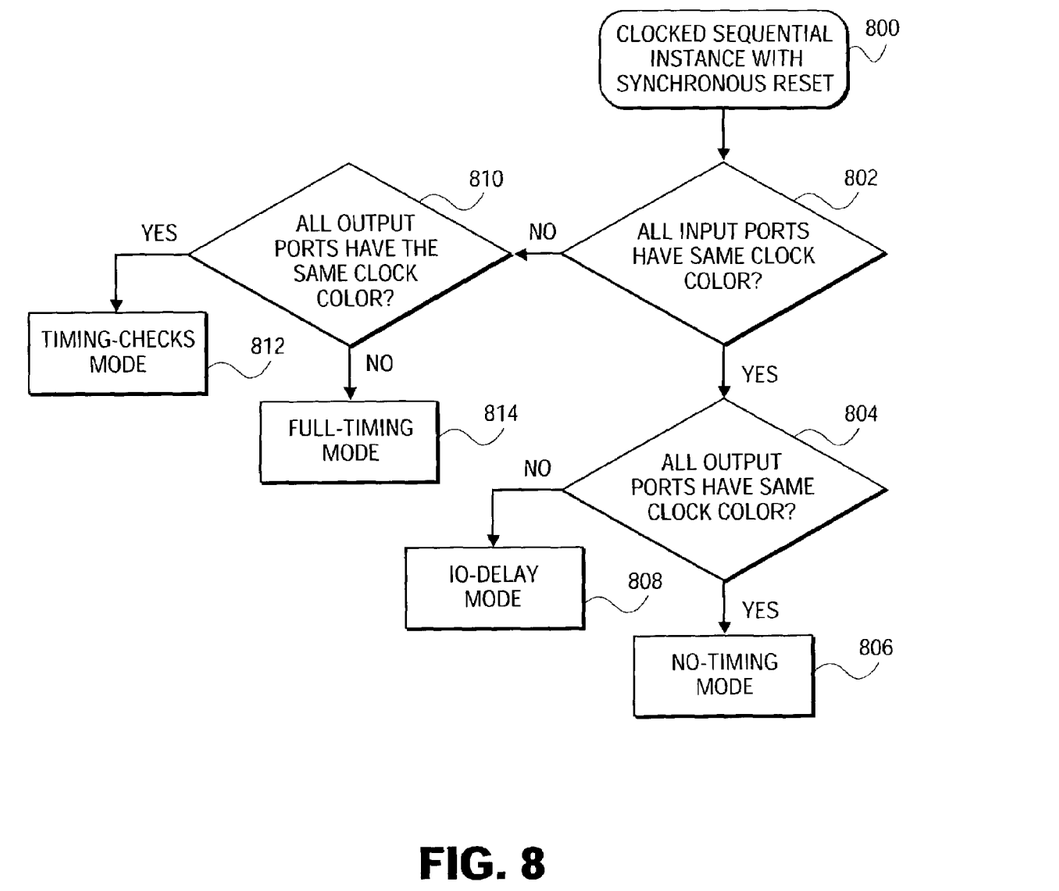
FIG. 8 depicts one approach for determining timing for a clocked sequential instance with no asynchronous reset.

FIG. 8 illustrates one approach for determining timing for a clocked sequential instance with no asynchronous reset. This method starts at block 800 and thereafter passes to block 802. A determination is made in block 802 as to whether or not all input ports have same clock color. If all input ports have same clock color, then the "Yes" path is taken and the method moves to block 804. A second determination is made in block 804 as to whether or not all output ports have same clock color. If all output ports have same clock color, then this instance is simulated in the No Timing mode (block 806). Alternatively, this instance is simulated in the IO Delay mode (block 808). But if the determination in block 802 turns out that all input ports don't have same clock color, then the method moves on to block 810 where another determination is made as to whether or not all output ports have same clock color. If all output ports have same clock color, then the instance is simulated in the Timing Check mode (block 812). Otherwise, the instance is simulated in the Full-Timing mode (block 814).

Figure 9:
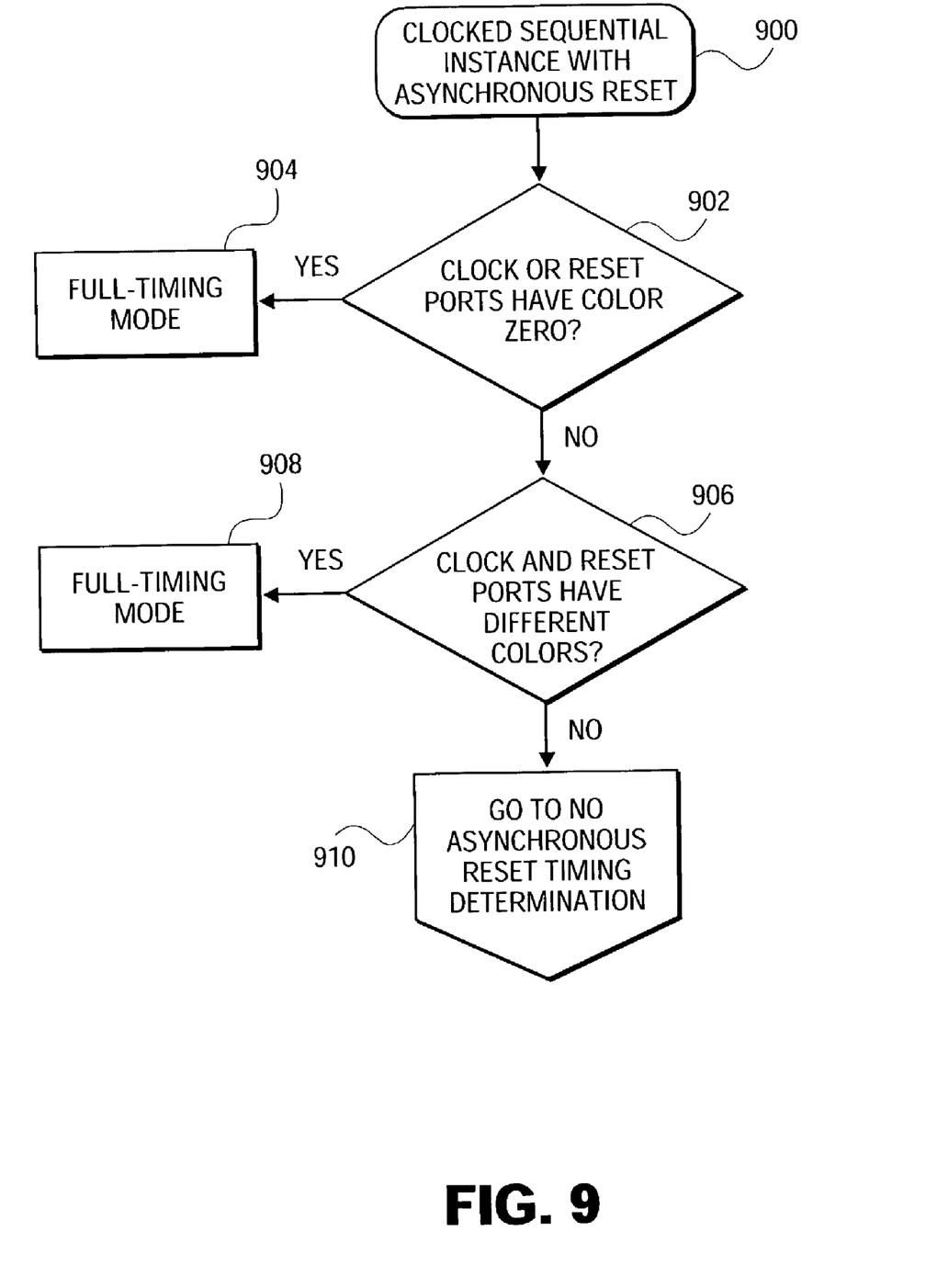
FIG. 9 depicts one approach for determining timing for a clocked sequential instance with asynchronous reset.

FIG. 9 illustrates one approach for determining timing for a clocked sequential instance with asynchronous reset. This method begins at block 900, and thereafter moves to block 902. A determination is made in block 902 as to whether or not the clock and reset ports have Color-Zero. If the clock or reset ports have Color-Zero, then the instance is simulated in Full-Timing mode (block 904). Otherwise, the "No" path is taken and the method continues at block 906 where a second determination is made as to whether or not the clock and reset ports have different colors. If the clock and reset ports have different colors, then the instance is simulated in the Full-Timing mode (block 908). Otherwise, the timing of this instance is further determined in the same manner as if there is no asynchronous reset port as illustrated in FIG. 8 (block 910).

At this point, it should be noted that although the invention has been described with reference to specific embodiments, it should not be construed to be so limited. Those of ordinary skill in the art can modify the claimed invention with the benefit of this disclosure without departing from the spirit of the invention. For example, modifications can be made to introduce minor variations of the timing behavior modes for simulation. In addition, different coloring schemes and formats of color representations can be employed with the disclosed invention. All of these modifications can be applied to achieve desired functional verification goals of electronic designs. These and other uses and modifications are within the spirit and scope of the present invention. Thus, the invention should not be limited by the specific examples used to illustrate it but only by the scope of the appended claim

What is claimed is:

1. A method for verifying an electronic design, comprising:
   determining clock domains of the electronic design;
   coloring each of a plurality of netlists of the electronic design based on the clock domain determination, with a color indicating a clock domain associated with each netlist, wherein the netlist coloring comprises coloring a clocked flip-flop instance including:
      if an asynchronous reset port does not exist, coloring output ports with the clock color of the flip-flop instance;
      if an asynchronous reset port exists, and the clock and reset ports have the same color, coloring output ports with the clock color of the flip-flop instance; and
      if an asynchronous reset port exists, and the clock and reset ports do not have the same color, coloring output ports with an initial color;
   assigning one of a plurality of simulation timing modes to each of a plurality of instances of the electronic design based on the netlist coloring; and
   simulating each of the plurality of instances of the electronic design in the respective assigned simulation timing mode.

2. The method of claim 1, wherein the clock domain determination comprises assigning a plurality of user-defined clock signals with a plurality of clock colors represented by a corresponding plurality of computer recognizable symbols.

3. The method of claim 2, wherein an initial color of each port of the electronic design is represented by a computer recognizable symbol.

4. The method of claim 2, wherein the clock domain determination further comprises:
   identifying a list of synchronous instances of the electronic design; and
   traversing the list of synchronous instances by tracing the loads of each user-defined clock signal progressively, until all synchronous instances controlled by a given clock signal are determined.

5. The method of claim 4, wherein the list of synchronous instances comprises a flip-flop having at least an input port, an output port, a reset port and a clock port.

6. The method of claim 4, wherein the list of synchronous instances comprises a pair of latches having a first latch and a second latch, each latch having at least an input port, an output port, a clock port, and an exclusive region exists between the first latch and the second latch.

7. The method of claim 6, wherein the exclusive region exists when each latch is controlled by a separate clock in different phases.

8. The method of claim 4, wherein the synchronous instance traversing comprises determining domain crossing, wherein electronic data being transferred between two different clock domains is detected.

9. A method for verifying an electronic design, comprising:
   determining clock domains of the electronic design;
   coloring each of a plurality of netlists of the electronic design based on the clock domain determination, with a color indicating a clock domain associated with each netlist, wherein the netlist coloring comprises coloring a clocked latch instance including:
      if an asynchronous reset port exists, and the clock and reset ports have different color, coloring output ports with an initial color;
      if an asynchronous reset port exists, and the clock and reset ports have the same color, and an exclusive region exists, coloring output ports with the clock color;
      if an asynchronous reset port does not exist, and an exclusivity region exists, coloring output ports with the clock color; and
      if an asynchronous reset port does not exist, and an exclusivity region does not exist, coloring output ports according to a method of coloring a combinational instance;
   assigning one of a plurality of simulation timing modes to each of a plurality of instances of the electronic design based on the netlist coloring; and
   simulating each of the plurality of instances of the electronic design in the respective assigned simulation timing mode.

10. A method for verifying an electronic design, comprising:
    determining clock domains of the electronic design;
    coloring each of a plurality of netlists of the electronic design based on the clock domain determination, with a color indicating a clock domain associated with each netlist;
    assigning one of a plurality of simulation timing modes to each of a plurality of instances of the electronic design based on the netlist coloring, wherein the simulation timing mode assignment comprises:
       assigning a simulation timing mode to a combinational instance;
       assigning a simulation timing mode to a clocked sequential instance with synchronous reset port; and
       assigning a simulation timing mode to a clocked sequential instance with asynchronous reset port; and
    simulating each of the plurality of instances of the electronic design in the respective assigned simulation timing mode.

11. The method of claim 10, wherein the netlist coloring comprises one or more of:
    coloring a combinational instance;
    coloring a clocked flip-flop instance; or
    coloring a clocked latch instance.

12. The method of claim 10, wherein the netlist coloring comprises coloring a combinatorial instance including:
    if any input port has a different color than the input port color being propagated, coloring output ports with an initial color; and
    if any input port does not have a different color than the input port color being propagated, coloring output ports with the input port color to be propagated.

13. The method of claim 10, wherein the simulation timing mode assignment comprises:
    if any port has an initial color, assigning the combinational instance a Full-Timing simulation mode;
    if no port has the initial color, and all ports have the same color, assigning the combinational instance a No-Timing simulation mode; and
    if no port has the initial color, and all ports do not have the same color, assigning the combinational instance a Full-Timing simulation mode.

14. The method of claim 10, wherein the simulation timing mode for the clocked sequence instance with synchronous reset port assignment comprises:

if all input ports have the same clock color, and all output ports have the same clock color, assigning the clocked sequential instance with synchronous reset port a No-Timing simulation mode;

if all input ports have the same clock color, and all output ports do not have the same clock color, assigning the clocked sequential instance with synchronous reset port an IO-Delay simulation mode;

if all input ports do not have the same clock color, and all output ports have the same clock color, assigning the clocked sequential instance with synchronous reset port a Timing-Check simulation mode; and if all input ports do not have the same clock color, and all output ports have the same clock color, assigning the clocked sequential instance with synchronous reset port a Full-Timing simulation mode.

15. The method of claim 10, wherein the simulation timing mode for the clocked sequential instance with asynchronous reset port assignment comprises:

if the clock or reset ports have an initial color, assigning the clocked sequential instance with asynchronous reset port a Full-Timing simulation mode;

if the clock or reset ports don't have the initial color, and the clock and reset ports have different colors, assigning the clocked sequential instance with asynchronous reset port a Full-Timing simulation mode; and if the clock or reset ports don't have the initial color, and the clock and reset ports have same colors, determining timing of the clocked sequential instance with asynchronous reset port the same way as the clock sequential instance with synchronous reset port.

16. A method for verifying an electronic design, comprising:

determining clock domains of the electronic design;

coloring each of a plurality of netlists of the electronic design based on the clock domain determination, with a color indicating a clock domain associated with each netlist;

assigning one of a plurality of simulation timing modes to each of a plurality of instances of the electronic design based on the netlist coloring; and simulating each of the plurality of instances of the electronic design in the respective assigned simulation timing mode, wherein the instance simulating comprises:

if the instance is assigned a Full-Timing simulation mode, simulating the instance with complete timing information included;

if the instance is assigned a No-Timing simulation mode, simulating the instance with all timing delays and timing checks removed;

if the instance is assigned a Timing-Check simulation mode, simulating the instance with input timing checks performed; and if the instance is assigned a IO-Delay simulation mode, simulating the instance with input and output path delays included.

17. A computer readable medium carrying one or more sequences of one or more instructions for verifying an electronic design, wherein the execution of the one or more sequences of the one or more instructions causes the one or more processors to perform:

determining clock domains of the electronic design;

coloring each of a plurality of netlists of the electronic design based on the clock domain determination, with a color indicating a clock domain associated with each netlist, wherein the netlist coloring comprises coloring a clocked flip-flop instance including:

if an asynchronous reset port does not exist, coloring output ports with the clock color of the flip-flop instance;

if an asynchronous reset port exists, and the clock and reset ports have the same color, coloring output ports with the clock color of the flip-flop instance; and if an asynchronous reset port exists, and the clock and reset ports do not have the same color, coloring output ports with an initial color;

assigning one of a plurality of simulation timing modes to each of a plurality of instances of the electronic design based on the netlist coloring; and simulating each of the plurality of instances of the electronic design in the respective assigned simulation timing mode.

18. The computer readable medium of claim 17, wherein the clock domain determination comprises assigning a plurality of user-defined clock signals with a plurality of clock colors represented by a corresponding plurality of computer recognizable symbols.

19. The computer readable medium of claim 18, wherein an initial color of each port of the electronic design is represented by a computer recognizable symbol.

20. The computer readable medium of claim 18, wherein the clock domain determination further comprises:

identifying a list of synchronous instances of the electronic design; and traversing the list of synchronous instances by tracing the loads of each user-defined clock signal progressively, until all synchronous instances controlled by a given clock signal are determined.

21. The computer readable medium of claim 20, wherein the list of synchronous instances comprises a flip-flop having at least an input port, an output port, a reset port and a clock port.

22. The computer readable medium of claim 20, wherein the list of synchronous instances further comprises a pair of latches having a first latch and a second latch, each latch having at least an input port, an output port, a clock port and a clock port, and an exclusive region exists between the first latch and the second latch.

23. The computer readable medium of claim 22, wherein the exclusive region exists in the pair of latches when each latch is controlled by a separate clock in different phases.

24. The computer readable medium of claim 20, wherein the synchronous instance traversing comprises determining domain crossing, where electronic data being transferred between two different clock domains is detected.

25. A computer readable medium carrying one or more sequences of one or more instructions for verifying an electronic design, wherein the execution of the one or more sequences of the one or more instructions causes the one or more processors to perform:

determining clock domains of the electronic design;

coloring each of a plurality of netlists of the electronic design based on the clock domain determination, with a color indicating a clock domain associated with each netlist, wherein the netlist coloring comprises coloring a clocked latch instance including:

if an asynchronous reset port exists, and the clock and reset ports have different color, coloring output ports with an initial color;

if an asynchronous reset port exists, and the clock and reset ports have the same color, and an exclusive region exists, coloring output ports with the clock color;

if an asynchronous reset port does not exist, and an exclusivity region exists, coloring output ports with the clock color; and if an asynchronous reset port does not exist, and an exclusivity region does not exist, coloring output ports according to method of coloring a combinational instance;

assigning one of a plurality of simulation timing modes to each of a plurality of instances of the electronic design based on the netlist coloring; and simulating each of the plurality of instances of the electronic design in the respective assigned simulation timing mode.

26. A computer readable medium carrying one or more sequences of one or more instructions for verifying an electronic design, wherein the execution of the one or more sequences of the one or more instructions causes the one or more processors to perform:

determining clock domains of the electronic design;

coloring each of a plurality of netlists of the electronic design based on the clock domain determination, with a color indicating a clock domain associated with each netlist;

assigning one of a plurality of simulation timing modes to each of a plurality of instances of the electronic design based on the netlist coloring, wherein the simulation timing mode assignment comprises:

assigning a simulation timing mode to a combinational instance;

assigning a simulation timing mode to a clocked sequential instance with synchronous reset port; and assigning a simulation timing mode to a clocked sequential instance with asynchronous reset port; and simulating each of the plurality of instances of the electronic design in the respective assigned simulation timing mode.

27. The computer readable medium of claim 26, wherein the netlist coloring comprises one or more of:
coloring a combinational instance;
coloring a clocked flip-flop instance; or
coloring a clocked latch instance.

28. The computer readable medium of claim 26, wherein the netlist coloring comprises coloring a combinatorial instance including:

if any input port has a different color than the input port color being propagated, coloring output ports with an initial color; and if any input port does not have a different color than the input port color being propagated, coloring output ports with the input port color to be propagated.

29. The computer readable medium of claim 26, wherein the simulation timing mode assignment comprises:

if any port has an initial color, assigning the combinational instance a Full-Timing simulation mode;

if no port has the initial color, and all ports have the same color, assigning the combinational instance a No-Timing simulation mode; and if no port has the initial color, and all ports do not have the same color, assigning the combinational instance a Full-Timing simulation mode.

30. The computer readable medium of claim 26, wherein the simulation timing mode for the clocked sequence instance with synchronous reset port assignment comprises:

if all input ports have the same clock color, and all output ports have the same clock color, assigning the clocked sequential instance with synchronous reset port a No-Timing simulation mode;

if all input ports have the same clock color, and all output ports do not have the same clock color, assigning the clocked sequential instance with synchronous reset port an IO-Delay simulation mode;

if all input ports do not have the same clock color, and all output ports have the same clock color, assigning the clocked sequential instance with synchronous reset port a Timing-Check simulation mode; and if all input ports do not have the same clock color, and all output ports have the same clock color, assigning the clocked sequential instance with synchronous reset port a Full-Timing simulation mode.

31. The computer readable medium of claim 26, wherein the simulation timing mode for the clocked sequence instance with asynchronous reset port assignment comprises:

if the clock or reset ports have an initial color, assigning the clocked sequential instance with asynchronous reset port the Full-Timing simulation mode;

if the clock or reset ports don't have the initial color, and the clock and reset ports have different colors, assigning the clocked sequential instance with asynchronous reset port a Full-Timing simulation mode; and if the clock or reset ports don't have the initial color, and the clock and reset ports have same colors, determining timing of the clocked sequential instance with asynchronous reset port the same way as the clock sequential instance with synchronous reset port.

32. A computer readable medium carrying one or more sequences of one or more instructions for verifying an electronic design, wherein the execution of the one or more sequences of the one or more instructions causes the one or more processors to perform:

determining clock domains of the electronic design;

coloring each of a plurality of netlists of the electronic design based on the clock domain determination, with a color indicating a clock domain associated with each netlist;

assigning one of a plurality of simulation timing modes to each of a plurality of instances of the electronic design based on the netlist coloring; and simulating each of the plurality of instances of the electronic design in the respective assigned simulation timing mode, wherein the instance simulating comprises:

if the instance is assigned a Full-Timing simulation mode, simulating the instance with complete timing information included;

if the instance is assigned a No-Timing simulation mode, simulating the instance with all timing delays and timing checks removed;

if the instance is assigned a Timing-Check simulation mode, simulating the instance with input timing checks performed; and if the instance is assigned a IO-Delay simulation mode, simulating the instance with input and output path delays included.

33. A system for verifying an electronic design, comprising:
  logic for determining clock domains of the electronic design;
  logic for coloring each of a plurality of netlists of the electronic design based on the clock domain determination, with a color indicating a clock domain associated with each netlist, wherein the netlist coloring logic comprises logic for coloring a clocked flip-flop instance including:
    if an asynchronous reset port does not exist, logic for coloring output ports with the clock color of the flip-flop instance;
    if an asynchronous reset port exists, and the clock and reset ports have the same color, logic for coloring output ports with the clock color of the flip-flop instance; and
    if an asynchronous reset port exists, and the clock and reset ports do not have the same color, logic for coloring output ports with an initial color;
  logic for assigning one of a plurality of simulation timing modes to each of the plurality of instances of the electronic design based on the netlist coloring; and
  logic for simulating each of the plurality of instances of the electronic design in the respective assigned simulation timing mode.

34. The system of claim 33, wherein the clock domain determination logic comprises logic for assigning a plurality of user-defined clock signals with a plurality of clock colors represented by a corresponding plurality of computer recognizable symbols.

35. The system of claim 34, wherein an initial color of each port of the electronic design is represented by a computer recognizable symbol.

36. The system of claim 34, wherein the clock domain determination logic further comprises:
  logic for identifying a list of synchronous instances of the electronic design; and
  logic for traversing the list of synchronous instances by tracing the loads of each user-defined clock signal progressively, until all synchronous instances controlled by a given clock signal are determined.

37. The system of claim 36, wherein the list of synchronous instances comprises a flip-flop having at least an input port, an output port, a reset port and a clock port.

38. The system of claim 36, wherein the list of synchronous instances comprises a pair of latches having a first latch and a second latch, each latch having at least an input port, an output port, a clock port, and an exclusive region exists between the first latch and the second latch.

39. The system of claim 38, wherein the exclusive region exists when each latch is controlled by a separate clock in different phases.

40. The system of claim 36, wherein the synchronous instance traversing logic further comprises logic for determining domain crossing, wherein electronic data being transferred between two different clock domains is detected.

41. A system for verifying an electronic design, comprising:
  logic for determining clock domains of the electronic design;
  logic for coloring each of a plurality of netlists of the electronic design based on the clock domain determination, with a color indicating a clock domain associated with each netlist, wherein the netlist coloring logic comprises logic for coloring a clocked latch instance including:
    if an asynchronous reset port exists, and the clock and reset ports have different color, logic for coloring output ports with an initial color;
    if an asynchronous reset port exists, and the clock and reset ports have the same color, and an exclusive region exists, logic for coloring output ports with the clock color;
    if an asynchronous reset port does not exist, and an exclusivity region exists, logic for coloring output ports with the clock color; and
    if an asynchronous reset port does not exist, and an exclusivity region does not exist, logic for coloring output ports according to a method of coloring a combinational instance;
  logic for assigning one of a plurality of simulation timing modes to each of the plurality of instances of the electronic design based on the netlist coloring; and
  logic for simulating each of the plurality of instances of the electronic design in the respective assigned simulation timing mode.

42. A system for verifying an electronic design, comprising:
  logic for determining clock domains of the electronic design;
  logic for coloring each of a plurality of netlists of the electronic design based on the clock domain determination, with a color indicating a clock domain associated with each netlist;
  logic for assigning one of a plurality of simulation timing modes to each of the plurality of instances of the electronic design based on the netlist coloring, wherein the simulation timing mode assignment logic comprises:
    logic for assigning a simulation timing mode to a combinational instance;
    logic for assigning a simulation timing mode to a clocked sequential instance with synchronous reset port; and
    logic for assigning a simulation timing mode to a clocked sequential instance with asynchronous reset port; and
  logic for simulating each of the plurality of instances of the electronic design in the respective assigned simulation timing mode.

43. The system of claim 42, wherein the netlist coloring logic comprises one or more of:
  logic for coloring a combinational instance;
  logic for coloring a clocked flip-flop instance; or
  logic for coloring a clocked latch instance.

44. The system of claim 42, wherein the netlist coloring logic comprises logic for coloring a combinatorial instance including:
  if any input port has a different color than the input port color being propagated, logic for coloring output ports with an initial color; and
  if any input port does not have a different color than the input port color being propagated, logic for coloring output ports with the input port color to be propagated.

45. The system of claim 42, wherein the simulation timing mode assignment logic comprises:
  if any port has an initial color, logic for assigning the combinational instance a Full-Timing simulation mode;
  if no port has the initial color, and all ports have the same color, logic for assigning the combinational instance a No-Timing simulation mode; and if no port has the initial color, and all ports do not have the same color, logic for assigning the combinational instance a Full-Timing simulation mode.

46. The system of claim 42, wherein the simulation timing mode for the clocked sequential instance with synchronous reset port assignment logic comprises:

if all input ports have the same clock color, and all output ports have the same clock color, logic for assigning the clocked sequential instance with synchronous reset port a No-Timing simulation mode;

if all input ports have the same clock color, and all output ports do not have the same clock color, logic for assigning the clocked sequential instance with synchronous reset port an IO-Delay simulation mode;

if all input ports do not have the same clock color, and all output ports have the same clock color, logic for assigning the clocked sequential instance with synchronous reset port a Timing-Check simulation mode; and if all input ports do not have the same clock color, and all output ports have the same clock color, logic for assigning the clocked sequential instance with synchronous reset port a Full-Timing simulation mode.

47. The system of claim 42, wherein the simulation timing mode for the clocked sequential instance with asynchronous reset port assignment logic comprises:

if the clock or reset ports have an initial color, logic for assigning the clocked sequential instance with asynchronous reset port a Full-Timing simulation mode;

if the clock or reset ports don't have the initial color, and the clock and reset ports have different colors, logic for assigning the clocked sequential instance with asynchronous reset port a Full-Timing simulation mode; and if the clock or reset ports don't have the initial color, and the clock and reset ports have same colors, logic for determining timing of the clocked sequential instance with asynchronous reset port the same way as the clock sequential instance with synchronous reset port.

48. A system for verifying an electronic design, comprising:

logic for determining clock domains of the electronic design;

logic for coloring each of a plurality of netlists of the electronic design based on the clock domain determination, with a color indicating a clock domain associated with each netlist;

logic for assigning one of a plurality of simulation timing modes to each of the plurality of instances of the electronic design based on the netlist coloring; and logic for simulating each of the plurality of instances of the electronic design in the respective assigned simulation timing mode, wherein the instance simulating logic comprises:

if the instance has a Full-Timing simulation mode, logic for simulating the instance with complete timing information included;

if the instance has a No-Timing simulation mode, logic for simulating the instance with all timing delays and timing checks removed;

if the instance has a Timing-Check simulation mode, logic for simulating the instance with input timing checks performed; and if the instance has a IO-Delay simulation mode, logic for simulating the instance with input and output path delays included.

* * * * *